(12) United States Patent
Sharma et al.

(10) Patent No.: US 11,848,542 B1
(45) Date of Patent: *Dec. 19, 2023

(54) ACTIVE OPTICS FEEDBACK AND CALIBRATION

(71) Applicant: Meta Platforms Technologies, LLC, Menlo Park, CA (US)

(72) Inventors: Robin Sharma, Redmond, WA (US); Katherine Marie Smyth, Seattle, WA (US); Andrew John Ouderkirk, Redmond, WA (US); Karol Constantine Hatzilias, Kenmore, WA (US); Christopher Yuan-Ting Liao, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 553 days.

This patent is subject to a terminal disclaimer.

(21) Appl. No.: 16/424,483

(22) Filed: May 29, 2019

(51) Int. Cl.
*G02B 27/09* (2006.01)
*H01S 5/42* (2006.01)
(Continued)

(52) U.S. Cl.
CPC .......... *H01S 5/423* (2013.01); *G02B 27/0955* (2013.01); *H01S 5/0085* (2013.01); *H01S 5/183* (2013.01)

(58) Field of Classification Search
CPC .............. G02B 27/0172; G02B 27/017; G02B 2027/0178; G02B 27/0075; G02B 27/10; G02B 27/1006; G02B 27/106; G02B 27/1066; G02B 27/1073; G02B 27/108; G02B 27/0179; G02B 21/0032;
(Continued)

(56) References Cited

U.S. PATENT DOCUMENTS 6,229,503 B1 * 5/2001 Mays, Jr. ........... G02B 27/0172 345/7
2002/0163483 A1 * 11/2002 Crist ..................... G02B 27/01 345/7

(Continued)

OTHER PUBLICATIONS

U.S. Appl. No. 16/424,484, Unpublished, Robin Sharma.
(Continued)

*Primary Examiner* — Christopher Stanford
*Assistant Examiner* — Journey F Sumlar
(74) *Attorney, Agent, or Firm* — FREESTONE INTELLECTUAL PROPERTY LAW PLLC; Aaron J. Visbeek; William J. Pigott

(57) ABSTRACT

An optical system includes an illumination layer, an optical combiner, and an active optics block. The illumination layer includes an array of point light sources configured to emit calibration light. The optical combiner is configured to pass visible light to a front side of the optical system and to direct the calibration light to a camera that generates an image in response to the calibration light. The image includes an array of points corresponding to the array of point light sources. The active optics block includes an adjustable lens disposed between the illumination layer and the optical combiner and is configured to pass the calibration light to the optical combiner and to focus the visible light. The active optics block is further configured to adjust an optical power of the adjustable lens based on the image of the array of points.

19 Claims, 8 Drawing Sheets

(51) Int. Cl.
*H01S 5/00* (2006.01)
*H01S 5/183* (2006.01)

(58) Field of Classification Search
CPC .... G02B 27/01; G02B 27/0101; G02B 27/30; G02B 30/00; G02B 30/10
See application file for complete search history.

(56) References Cited

U.S. PATENT DOCUMENTS

| | | | |
|---|---|---|---|
| 2016/0041384 A1 | 2/2016 | Robbins et al. | |
| 2017/0118423 A1* | 4/2017 | Zhou | G02B 27/0068 |
| 2017/0177075 A1* | 6/2017 | Zhang | G02B 27/0093 |
| 2017/0184847 A1 | 6/2017 | Petrov | |
| 2018/0329065 A1* | 11/2018 | Pacala | G01S 7/4816 |
| 2019/0179409 A1 | 6/2019 | Jones et al. | |
| 2020/0051320 A1 | 2/2020 | Laffont et al. | |

OTHER PUBLICATIONS

Non-Final Office Action, U.S. Appl. No. 16/424,484, dated Sep. 28, 2020, 14 pages.
Porter J., et al., "Adaptive Optics for Vision Science: Principles, Practice, Design, and Applications," Oct. 20, 2005, Chapter 5, p. 125.
Final Office Action, U.S. Appl. No. 16/424,484 dated Apr. 14, 2021, 13 pages.

* cited by examiner though the same one Newton of force at higher elevations (e.g., on top of a skyscraper). Various other conditions may cause the adjustable lens and/or actuators to become out of calibration, such

ACTIVE OPTICS FEEDBACK AND CALIBRATION

CROSS-REFERENCE TO RELATED APPLICATION

This application is related to a U.S. non-provisional patent application Ser. No. 16/424,484 entitled, "HEAD MOUNTED DISPLAY WITH ACTIVE OPTICS FEEDBACK AND CALIBRATION," filed May 29, 2019.

FIELD OF DISCLOSURE

Aspects of the present disclosure relate generally to active optics, and in particular but not exclusively, relate to feedback and calibration for active optics.

BACKGROUND

A head mounted display (HMD) is a display device, typically worn on the head of a user. HMDs may be used in a variety of applications, such as gaming, aviation, engineering, medicine, entertainment and so on to provide artificial reality content to a user. Artificial reality is a form of reality that has been adjusted in some manner before presentation to the user, which may include, e.g., virtual reality (VR), augmented reality (AR), mixed reality (MR), hybrid reality, or some combination and/or derivative thereof. Some HMDs may be configured to present virtual elements to the user. For example, stereoscopic images can be displayed on an electronic display inside the headset to simulate the illusion of depth where various sensors can be used to estimate what portion of the virtual element is being viewed by the user. Such a simulation, however, can cause visual fatigue and nausea if vergence and accommodation conflicts are not correctly accounted for. Accordingly, an HMD may be configured to adjust its focus based on a location within a virtual scene presented by the HMD that the user views.

BRIEF DESCRIPTION OF THE DRAWINGS

Non-limiting and non-exhaustive aspects of the present disclosure are described with reference to the following figures, wherein like reference numerals refer to like parts throughout the various views unless otherwise specified.

DETAILED DESCRIPTION

Various aspects and embodiments are disclosed in the following description and related drawings to show specific examples relating to active optics feedback and calibration. Alternate aspects and embodiments will be apparent to those skilled in the pertinent art upon reading this disclosure and may be constructed and practiced without departing from the scope or spirit of the disclosure. Additionally, well-known elements will not be described in detail or may be omitted so as to not obscure the relevant details of the aspects and embodiments disclosed herein.

As mentioned above, an optical system of an HMD may be configured to dynamically adjust its focus by way of an adjustable lens. In some instances, the adjustable lens may be a flexible polymer lens, a liquid lens, a deformable mirror, a liquid crystal lens, and so on. Control of the adjustable lens may be achieved via one or more actuators that vary an optical power or focal length of the adjustable lens. Conventional systems may include a look-up table that correlates various actuations (e.g., force, control signal, etc.) applied by the actuators to achieve a certain change in the optical power of the adjustable lens. However, various conditions may arise that may cause the adjustable lens and/or actuators to become out of calibration. For example, an adjustable lens may be subjected to various atmospheric pressures, such as when a user's altitude changes when riding in an elevator. When subjected to changes in atmospheric pressure, the change in optical power may differ for the same amount of actuation applied to the adjustable lens. By way of example, one Newton of force applied to a liquid lens at sea level may result in a deformation of the lens different from the deformation applied by the same one Newton of force at higher elevations (e.g., on top of a skyscraper). Various other conditions may cause the adjustable lens and/or actuators to become out of calibration, such as actuator sag, stress on the membranes of the adjustable lens, hysteresis in the actuators, or other failure modes of the adjustable lens/actuators.

Accordingly, aspects of the present disclosure provide an optical system that includes dynamically-generated feedback for an adjustable lens to ensure that the actuation applied to the adjustable lens results in the desired change in optical power of the adjustable lens. These and other features will be described in more detail below.

Figure 1:
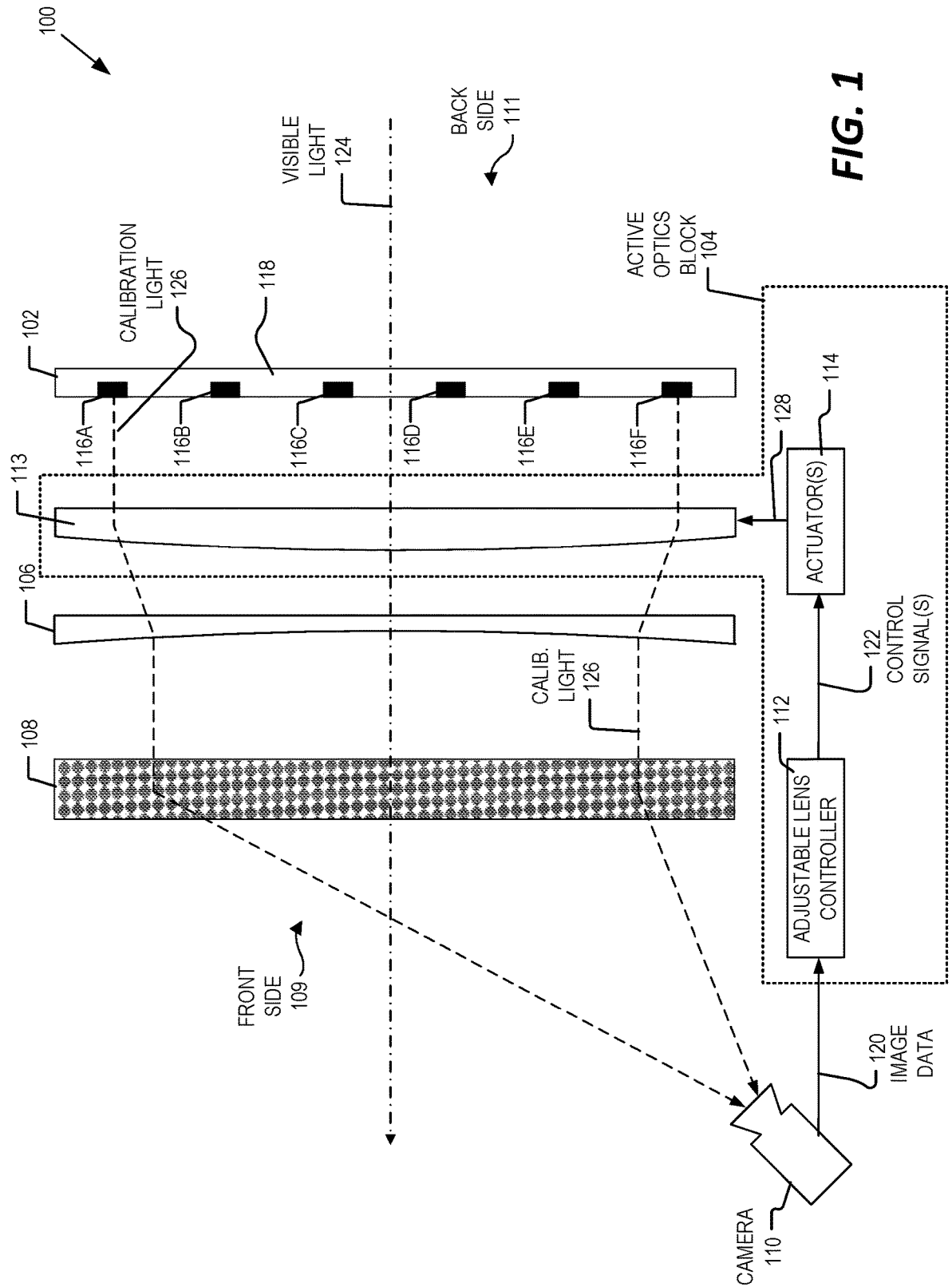
FIG. 1 illustrates an optical system, in accordance with aspects of the present disclosure.

FIG. 1 illustrates an optical system 100, in accordance with aspects of the present disclosure. The illustrated example of optical system 100 is shown as including an illumination layer 102, an active optics block 104, an optional second lens 106, an optical combiner 108, and a camera 110. The illumination layer 102 is shown as including a plurality of point light sources 116A-116F disposed on a transparent substrate 118. Active optics block 104 is shown as including an adjustable lens controller 112, an adjustable lens 113, and actuator(s) 114.

In some aspects, each of the point light sources 116A-116F may be disposed on transparent substrate 118, arranged in a pattern (e.g., a two-dimensional array of rows and columns) and may be configured to emit calibration light 126 through the adjustable lens 113. In some examples, the calibration light 126 is collimated light. In further examples, the calibration light 126 is infrared light such as light in the near infrared spectrum (e.g. 750 nm-1.4 μm). In some examples, each point light source 116A-116F may be an emitter, such as a micro light emitting diode (micro-LED), an edge emitting LED, or a vertical cavity surface emitting laser (VCSEL) diode. In other examples, illumination layer 102 may include a lightguide with light extraction features such as indents, protrusions, prisms, gratings etc., for providing the array of point light sources 116A-116F. In this example, a light source on the edge of illumination layer 102 may illuminate the lightguide that is configured to generate calibration light 126. In another example, illumination layer 102 may include an array of partial mirrors or full mirrors that are illuminated by a light source and the array of mirrors redirects the light from the light source as calibration light 126.

As shown in FIG. 1, the point light sources 116A-116F are disposed on the transparent substrate 118 for through-focus viewing. That is, the point light sources 116A-116F may be disposed within the field of view of the optical system 100. While point light sources 116A-116F may introduce minor occlusions into the optical system 100, the point light sources 116A-116F, as well as their corresponding routing may be so small as to be unnoticeable or insignificant. Additionally, as will be described below with reference to FIG. 5, when optical system 100 is incorporated into a head mounted display (HMD), any occlusion from point light sources 116A-116F will be placed so close to the user's eye so as to be unfocusable by the human eye and therefore assist in the point light sources 116A-116F being not noticeable or insignificant. In some embodiments, each point light source 116A-116F has a footprint (or size) that is less than about 200×200 microns.

As mentioned above, the point light sources 116A-116F of the illumination layer 102 may be configured to emit calibration light 126 through the adjustable lens 113 towards the front side 109 of the optical system 100. The optical system 100 is shown as including an optical combiner 108, where the optical combiner 108 is disposed between the illumination layer 102 and the front side 109 of the optical system 100. In some aspects, the optical combiner 108 is configured to receive the calibration light 126 and to direct the calibration light 126 towards the camera 110. In some examples, the camera 110 is an infrared camera configured to generate a calibration image based on the received calibration light 126. In some examples, the optical combiner 108 may be configured as a volume hologram and/or may include one or more Bragg gratings for directing the calibration light 126 towards the camera 110.

In some aspects, the illumination layer 102, including the transparent substrate 118, as well as the optical combiner 108 are configured to pass visible light 124 to the front side 109 of the optical system 100. That is, the illumination layer 102 and the optical combiner 108 may be transmissive to visible light 124. Visible light 124 may be light that is incident on the back side 111 of the optical system 100. In some examples, visible light 124 is scene light received from the surrounding environment. In other examples, visible light 124 is display light generated by an electronic display, such as may be included in an HMD. In one example, adjustable lens 113 is configured to focus the visible light 124 on the front side 109 of the optical system 100.

Figure 2A:
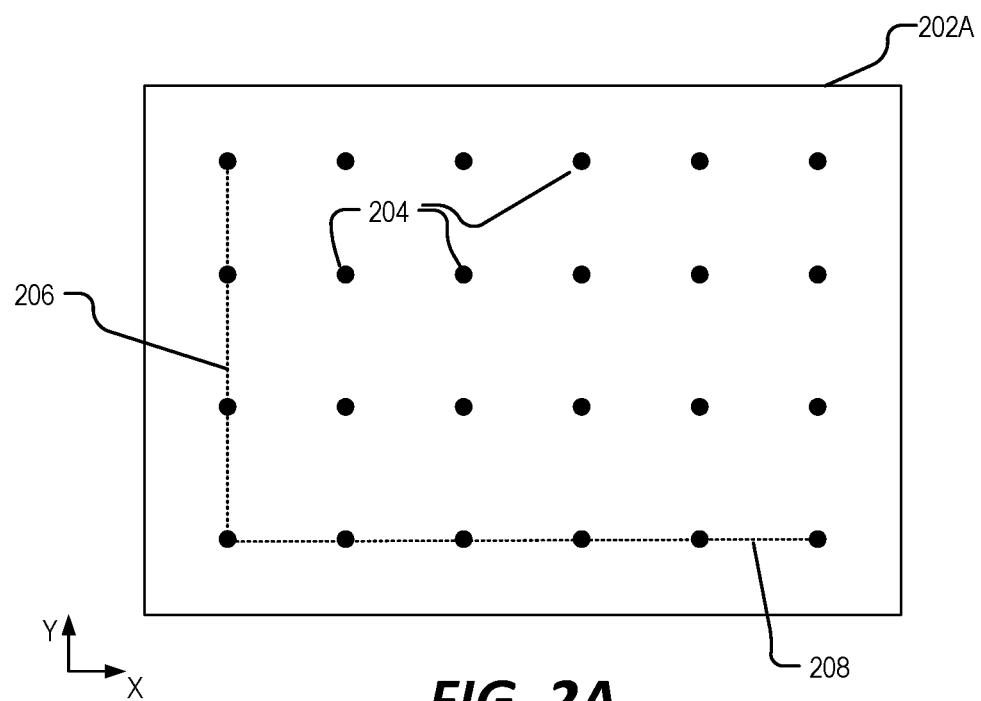
FIGS. 2A and 2B illustrate calibration images of an optical system, captured by a camera, in accordance with aspects of the present disclosure.
Figure 2B:
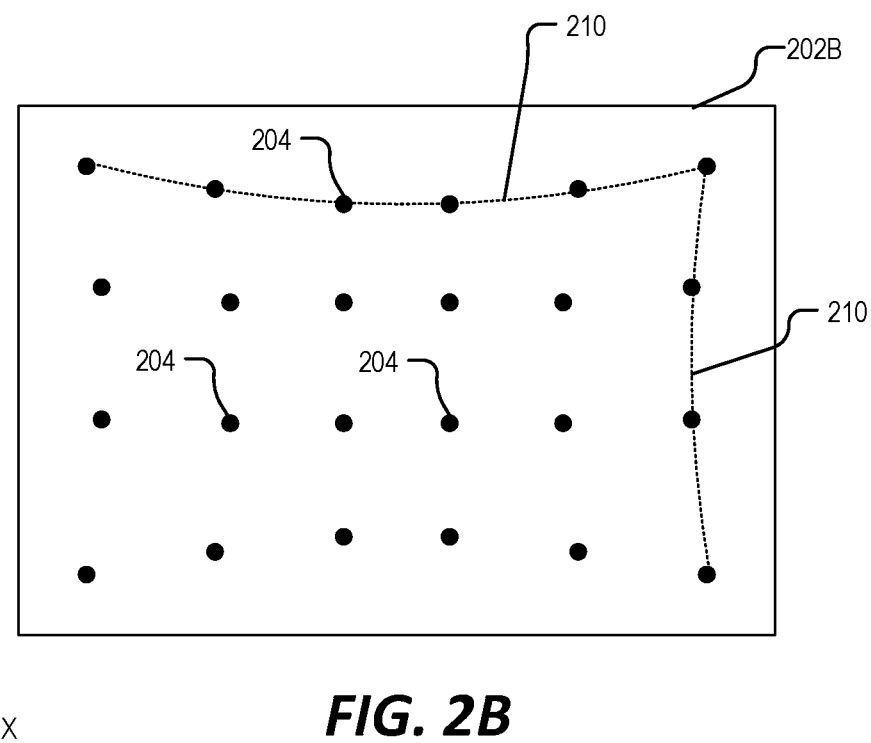

As mentioned above, optical combiner 108 is configured to direct the calibration light 126 to the camera 110. Camera 110 may be configured to generate one or more calibration images based on the received calibration light 126. For example, FIGS. 2A and 2B illustrate calibration images 202A and 202B, respectively, captured by a camera, in accordance with aspects of the present disclosure. Calibration images 202A and 202B are example calibration images captured by the camera 110 of FIG. 1.

As shown in FIG. 2A, calibration image 202A includes an array of points 204. In some examples, each point 204 represents a bright spot or intensity peak within calibration image 202A. In one aspect, calibration image 202A represents an image captured by a camera of an optical system (e.g., optical system 100 of FIG. 1) when the adjustable lens 113 is inactive. That is, calibration image 202A may be an image captured when no actuation is applied to the adjustable lens 113. As shown in FIG. 2A, the points 204 are arranged in a pattern within calibration image 202A. The pattern of the points 204, as included in calibration image 202A, corresponds to the pattern of the array of point light sources 116A-116F as included in illumination layer 102. That is, for example if the array of point light sources 116A-116F are arranged in a two-dimensional array (e.g., aligned rows and aligned columns), then the corresponding points 204 will appear in image 202A as a corresponding two-dimensional array (e.g., aligned rows 208 and aligned columns 206). The sources could also be distributed in some other geometry, not necessarily rectilinear. For example, the array of point light sources 116A-116F could arranged in a more complicated pattern than just a grid of points, like a matrix barcode (e.g., QR) that only shows up in the near infrared or the like. In some examples, the array of point light sources 116A-116F could be arranged in any pattern that has spatially varying content, such as a rich pattern of circles, squares, or a bar-code.

However, when adjustable lens 113 is active (e.g., actuation applied to the adjustable lens 113), the resultant calibration image may be distorted. For example, FIG. 2B illustrates a calibration image 202B that includes a distortion 210 in the array of points 204. That is, calibration image 202B shows the array of points 204, but where the points 204 no longer appear in a two-dimensional array of aligned rows and aligned columns. Accordingly, aspects of the present disclosure provide an optical system that compensates for the distortion (e.g., distortion 210) that may appear in the calibration images. In some examples, the optical system is configured to compensate for the distortion by adjusting the actuation applied by the actuators (e.g., actuators 114 of FIG. 1) in order to obtain a calibration image that no longer shows the previous distortion. That is, after adjusting the actuation applied by the actuators the resultant calibration image should approach the pattern of points 204 as shown in FIG. 2A.

Returning now to FIG. 1, active optics block 104 is configured to adjust an optical power of the adjustable lens 113 based on a calibration image (e.g., calibration image 202B of FIG. 2B). As shown in FIG. 1, the active optics block 104 includes an adjustable lens controller 112, adjustable lens 113, and one or more actuators 114. Adjustable lens controller 112 is configured to receive image data 120 generated by the camera 110. In some examples, the image data 120 includes one or more calibration images, such as calibration images 202A or 202B of FIGS. 2A and 2B. The adjustable lens controller 112 then processes the image data 120 to determine a distortion (e.g., distortion 210) in the array of points 204. In one example, adjustable lens controller 112 may determine the distortion by determining the location of one or more of the points included in the calibration image. In response to determining the distortion, the adjustable lens controller 112 may then generate one or more control signals 122 to adjust the actuation provided by the actuators 114 to adjust the optical power of the adjustable lens 113.

As mentioned above, in some examples, the adjustable lens 113 is a flexible polymer lens or a liquid lens. Thus, the actuators 114 may be configured to apply a mechanical force 128 to adjust a curvature and/or shape of the adjustable lens 113. In some aspects, a magnitude of the mechanical force 128 (e.g., in Newtons) applied by the actuators 114 is responsive to the control signals 122.

In some examples, the actuators 114 are disposed around the entire periphery of the adjustable lens 113. Thus, in one embodiment, all the actuators 114 are adjusted in order to adjust the optical power of the adjustable lens 113. In another embodiment, only some of the actuators 114 are adjusted to correct for localized distortion that is detected in the calibration image. For example, assuming that the calibration image shows distortion only in the upper right-hand corner of the image, then the adjustable lens controller 112 may generate the control signals 122 to only adjust the actuation provided by the actuators 114 that would affect the upper right-hand corner of the image.

Figure 3:
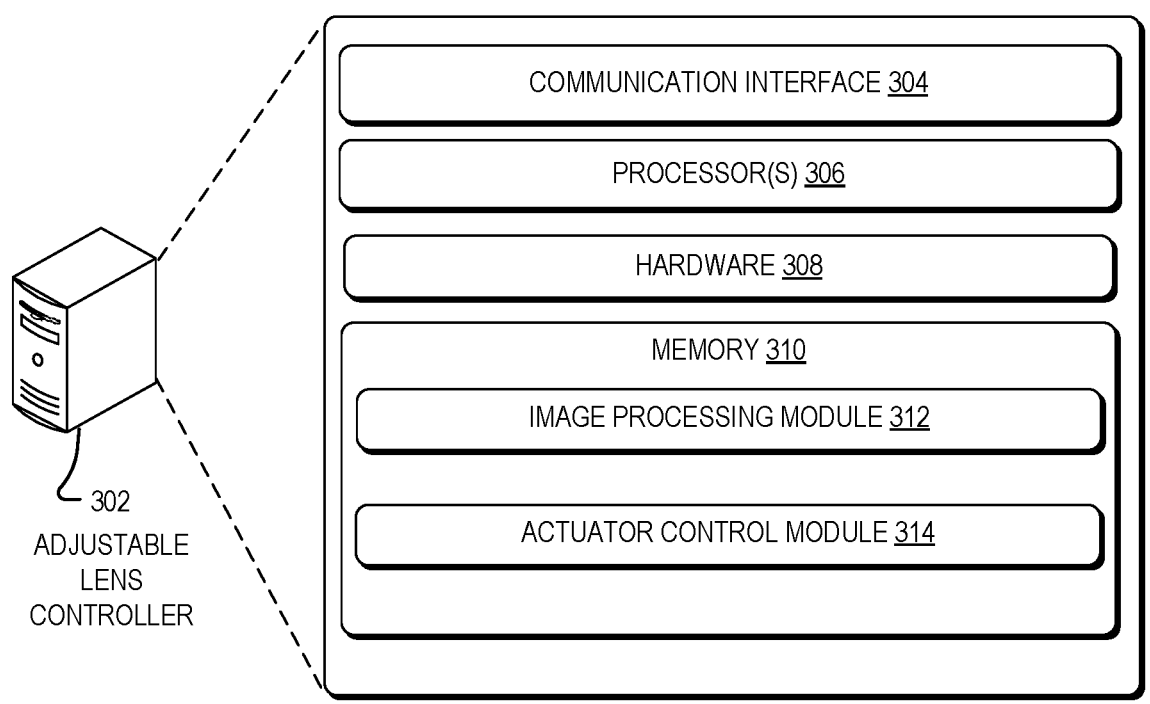
FIG. 3 illustrates an adjustable lens controller, in accordance with aspects of the present disclosure.

FIG. 3 illustrates an adjustable lens controller 302, in accordance with aspects of the present disclosure. The illustrated example of adjustable lens controller 302 is shown as including a communication interface 304, one or more processors 306, hardware 308, and a memory 310. The adjustable lens controller 302 of FIG. 3 is one possible implementation of the adjustable lens controller 112 of FIG. 1.

The communication interface 304 may include wireless and/or wired communication components that enable the adjustable lens controller 302 to transmit data to and receive data from other devices/components. The hardware 308 may include additional hardware interface, data communication, or data storage hardware. For example, the hardware interfaces may include a data output device, and one or more data input devices.

The memory 310 may be implemented using computer-readable media, such as computer storage media. In some aspects, computer-readable media may include volatile and/or non-volatile, removable and/or non-removable media implemented in any method or technology for storage of information such as computer-readable instructions, data structures, program modules, or other data. Computer-readable media includes, but is not limited to, RAM, ROM, EEPROM, flash memory or other memory technology, CD-ROM, digital versatile disks (DVD), high-definition multi-media/data storage disks, or other optical storage, magnetic cassettes, magnetic tape, magnetic disk storage or other magnetic storage devices, or any other non-transmission medium that can be used to store information for access by a computing device.

The processors 306 and the memory 310 of the adjustable lens controller 302 may implement an image processing module 312 and an actuator control module 314. The image processing module 312 and the actuator control module 314 may include routines, program instructions, objects, and/or data structures that perform particular tasks or implement particular abstract data types. The memory 310 may also include a data store (not shown) that is used by the image processing module 312 and/or actuator control module 314.

The image processing module 312 may be configured to receive images (e.g., calibration images 202A and 202B) and process the images to determine a distortion in the array of points included in the image. The image processing module 312 may then communicate with the actuator control module 314 based on the determined distortion. The actuator control module 314 may be configured to generate one or more control signals (e.g., control signals 122 of FIG. 1) to adjust the optical power of the adjustable lens to compensate for the determined distortion.

In some aspects, the actuator control module 314 includes an interface and/or logic for individually controlling each of the actuators 114. In one aspect, controlling an individual actuator 114 includes generating a control signal to cause the actuator 114 to apply a particular mechanical force 128 to the adjustable lens 113.

Figure 4:
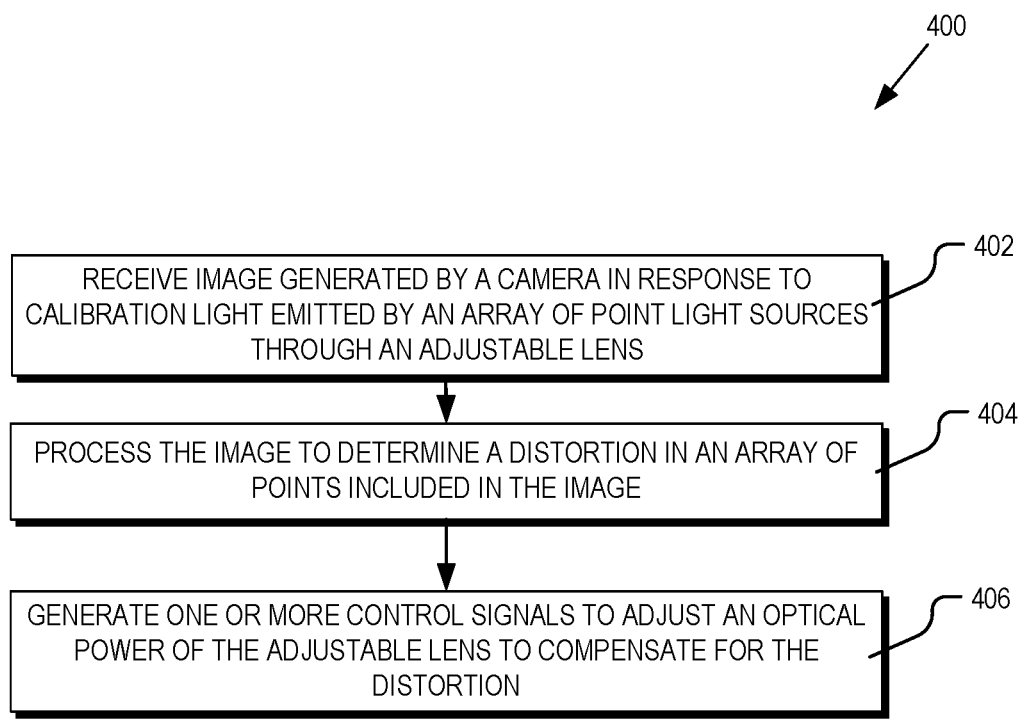
FIG. 4 is a flow chart illustrating a process of active optics feedback and calibration, in accordance with aspects of the present disclosure.

FIG. 4 is a flow chart illustrating a process 400 of active optics feedback and calibration, in accordance with aspects of the present disclosure. Process 400 is one possible process performed by the adjustable lens controller 112 of FIG. 1 and/or the adjustable lens controller 302 of FIG. 3.

In a process block 402, the image processing module 312 receives an image (e.g., calibration image 202B of FIG. 2B) that was generated by a camera (e.g., camera 110 of FIG. 1). As mentioned above, the camera 110 may generate the calibration image in response to calibration light 126 that was emitted by the array of point light sources 116A-116F through the adjustable lens 113. In some examples, the image processing module 312 receives the image via communication interface 304. Next, in a process block 404, the image processing module 312 processes the image to determine a distortion in the array of points included in the image. By way of example, image processing module 312 may detect the distortion 210 based on the location of one or more of the points 204 included in calibration image 202B. In process block 406, the actuator control module 314 generates one or more control signals (e.g., control signals 122 of FIG. 1) to adjust the optical power of the adjustable lens 113 to compensate for the detected distortion. In some examples, process block 406 includes the actuator control module 314 referencing a priori logic in the computation of appropriate actuator controls. For instance, the actuator control module 314 may reference a lookup table or control theory logic in order to generate the control signals.

The above embodiments discussed with reference to FIGS. 1-4 provide for an optical system that performs real-time feedback and calibration of an adjustable lens. The examples provided above may be incorporated into a variety of systems that would benefit from the dynamic adjustment of an adjustable lens. For example, the optical system 100 of FIG. 1 may be incorporated into a variety of laser systems, interferometers, systems with long optical cavities, and telescopes. In addition, the embodiments discussed above may be incorporated into an HMD. By way of example, FIG. 5 illustrates an optical system 500 of an HMD, in accordance with aspects of the present disclosure.

The illustrated example of optical system 500 includes illumination layer 102, optional second lens 106, and camera 110. The optical system 500 is shown as further including a display layer 502, a second illumination layer 506, an optical combiner 507, a switchable half-wave plate 508, a polarization layer 509, and an active optics block 514. The illustrated example of the second illumination layer 506 is shown as including a plurality of in-field light sources 512A-512F disposed on a transparent substrate 513.

In some examples, each of the illustrated layers of optical system 500, including display layer 502, illumination layer 102, adjustable lens 113, second lens 106, optical combiner 507, and second illumination layer 506 may appear transparent to a user of the HMD to facilitate augmented reality or mixed reality such that the user can view scene light 505 (e.g., visible light) from the environment while also receiving display light 503 directed to their eye 504 by way of display layer 502. In further examples, some or all of layers of optical system 500 may be incorporated into a virtual reality headset where the transparent nature of the optical system 500 allows the user to view an electronic display (e.g., a liquid crystal display (LCD), an organic light emitting diode (OLED) display, a micro-LED display, etc.) incorporated in the virtual reality headset.

Figure 5:
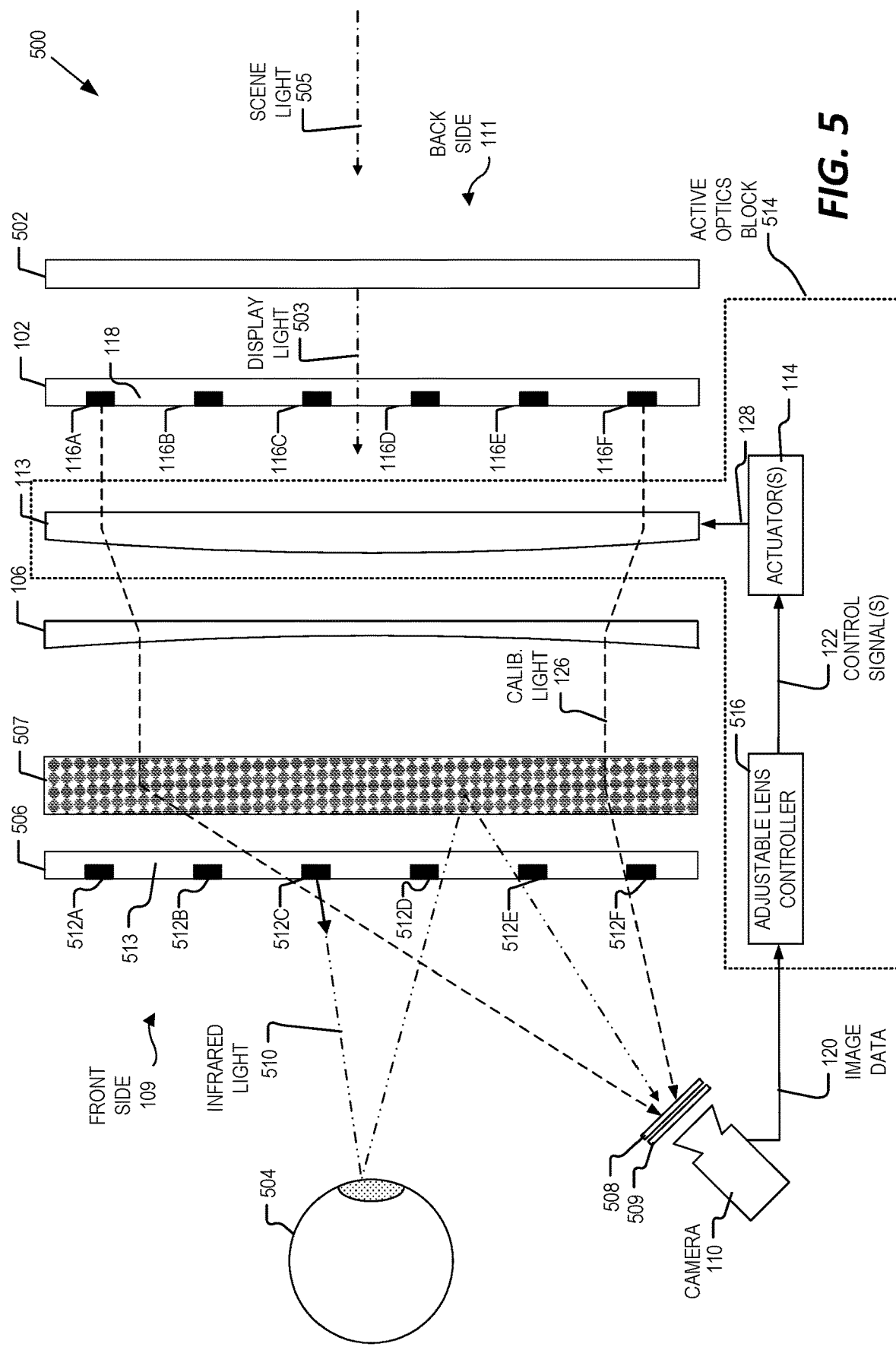
FIG. 5 illustrates an optical system of a head mounted display (HMD), in accordance with aspects of the present disclosure.

As shown in FIG. 5, the second illumination layer 506 includes a plurality of in-field light sources 512A-512F. Each in-field light source 512A-512F may be disposed on a transparent substrate 513 and may be configured to emit light towards the front side 109 of the optical system 500. In some aspects, the in-field light sources 512A-512F are configured to emit infrared light 510 in the near infrared spectrum (e.g. 750 nm-1.4 μm). Each in-field light source 512A-512F may be a micro light emitting diode (micro-LED), an edge emitting LED, or a vertical cavity surface emitting laser (VCSEL) diode.

In some examples, HMDs as provided herein may perform eye-tracking which may enhance the user's viewing experience. Eye-tracking may be aided, in some cases, by illuminating the eye of the user. Thus, the optical system 500 of FIG. 5 may incorporate an eye-tracking system that includes an illumination source (e.g., second illumination layer 506) as well as a camera (e.g., camera 110) for tracking movements of the user's eye 504. Conventional eye-tracking solutions may provide light sources disposed around a rim/periphery of a lens. However, placing the light sources directly in front of the eye may be advantageous for computation of "glint" reflections that can be imaged by a camera such as camera 110 that is positioned to image the eye 504. Furthermore, the ability to selectively illuminate each in-field light source 512A-512F individually (or in groups) may help save power and provide faster and more precise eye-tracking measurements.

While in-field light sources 512A-512F may introduce minor occlusions into the optical system 500, the in-field light sources 512A-512F, as well as their corresponding routing may be so small as to be unnoticeable or insignificant to a wearer of the HMD. Additionally, any occlusion from in-field light sources 512A-512F will be placed so close to the eye 504 as to be unfocusable by the human eye and therefore assist in the in-field light sources 512A-512F being not noticeable or insignificant. In some embodiments, each in-field light source 512A-512F has a footprint (or size) that is less than about 200×200 microns.

As mentioned above, the in-field light sources 512A-512F of the second illumination layer 506 may be configured to emit infrared light 510 towards the front side 109 of the optical system 500 to illuminate the eye 504 of a user. The optical system 500 is shown as including optical combiner 507, where the optical combiner 507 is disposed between the second illumination layer 506 and the adjustable lens 113. In some aspects, the optical combiner 507 is configured to receive reflected infrared light that is reflected by the eye 504 of the user and to direct the reflected infrared light towards the camera 110. For example, infrared light 510, emitted by in-field light sources 512A-512F, is shown as reflecting off the eye 504, propagating back through the second illumination layer 506 to the optical combiner 507, which then directs the reflected infrared light towards the camera 110 for imaging.

In some examples, the camera 110 is an infrared camera configured to image the eye of the user based on the received reflected infrared light. In some aspects, the optical combiner 507 is transmissive to visible light, such as scene light 505 incident on the back side 111 of the optical system 500 as well as display light 503 emitted by the display layer 502. In some examples, the optical combiner 507 may be configured as one or more volume holograms and/or may include one or more Bragg gratings for directing the reflected infrared light, as well as calibration light 126, towards the camera 110.

Display layer 502 may include one or more other optical elements depending on the design of the HMD. For example, the display layer 502 may include a waveguide (not shown in FIG. 5) to direct display light generated by an electronic display to the eye 504 of the user. In some implementations, at least a portion of the electronic display is included in a frame (e.g., periphery) of the HMD. The electronic display may include an LCD, an organic light emitting diode (OLED) display, micro-LED display, pico-projector, or liquid crystal on silicon (LCOS) display for generating the display light 503.

In some examples, an eye-tracking module of the HMD may be configured to determine eye-tracking information (e.g., location, orientation, gaze angle, etc. of the eye 504). In some aspects, the eye-tracking module may determine the eye-tracking information based on one or more images captured by the camera 110. For example, the eye-tracking module may be configured to receive an image captured by the camera 110 and process the image to detect one or more specular reflections. The eye-tracking module may then localize the detected specular reflections to determine eye-tracking information (e.g., position, orientation, gaze angle, etc. of the eye 504). For example, the eye-tracking module may determine whether the eye 504 is looking in the straight, left, right, upwards, or downwards direction.

In some aspects, the images captured by camera 110 are acquired at a predetermined sampling rate (e.g., 200 Hz). However, as mentioned above, the optical combiner 507 is configured to direct both the reflected infrared light (e.g., infrared light 510) and the calibration light 126 towards the camera 110. Accordingly, in some examples, optical system 500 includes a switchable half-wave plate 508 and a polarization layer 509 that are disposed between the camera 110 and the optical combiner 507. In some aspects, the switchable half-wave plate 508 and polarization layer 509 are configured to selectively time-multiplex between the calibration light 126 and the infrared light 510. For example, the switchable half-wave plate 508 along with the polarization layer 509 may be selectively controlled between a first state and a second state, where the first state includes allowing infrared light 510 to pass through to camera 110, while blocking the calibration light 126. The second state may include allowing calibration light 126 to pass through to the camera 110, while blocking the infrared light 510.

In some examples, the calibration light 126 has a first polarization orientation and the infrared light 510 has a second polarization orientation different from the first polarization orientation. Thus, in some examples, the switchable half-wave plate 508 is configured to alter or modulate a polarization of incident light, whereas the polarization layer 509 is configured to absorb light of a certain polarization. Thus, the combination of the switchable half-wave plate 508 and the polarization layer 509 may selectively control which of the calibration light 126 or the infrared light 510 is incident on the camera 110.

In other examples, rather than the polarization-based time multiplexing, described above, aspects of the present disclosure may utilize spectrum-based time multiplexing or spectrum-based spatial multiplexing for switching between the calibration light 126 and the infrared light 510. For example, camera 110 may include spectrally sensitive Bayer filters or a time-varying spectral filter.

In some aspects, the switchable half-wave plate 508 allows many more samples of the infrared light 510 to be captured by the camera 110 as compared to that of the calibration light 126. For example, assuming a 200 Hz sampling rate, the switchable half-wave plate 508 may allow the camera 110 to capture 199 images of the eye 504 (e.g., based on the infrared light 510) for every 1 calibration image captured per second (e.g., based on calibration light 126).

In other examples, the switchable half-wave plate 508 may be omitted, where active control of the illumination layer 102 and the second illumination layer 506 is implemented. For example, the adjustable lens controller 516 may be configured to generate one or more control signals (not shown) to enable/disable the point light sources 116A-116F as well as the in-field light sources 512A-512F. In one example, the point light sources 116A-116F may be disabled and in-field light sources 512A-512F enabled while performing eye-tracking operations. Similarly, the point light sources 116A-116F may be enabled and in-field light sources 512A-512F disabled while performing the calibration of the adjustable lens 113.

Thus, in some embodiments, camera 110 is configured to capture images for eye-tracking operations, while also periodically capturing calibration images for feedback and calibration of the adjustable lens 113. In addition, the calibration of the adjustable lens 113 may be responsive to one or more triggers, such as the startup of the HMD, or based on one or more sensors included in the HMD. For example, the HMD may include one or more sensors to determine an orientation of the user of the HMD (e.g., whether the user is sitting/standing upright or laying down). In some examples, a change in the orientation of the user of an HMD may trigger the optical system 500 to perform a calibration of the adjustable lens 113 since the adjustable lens 113 and/or actuators 114 may react differently based on the user's orientation.

Figure 6:
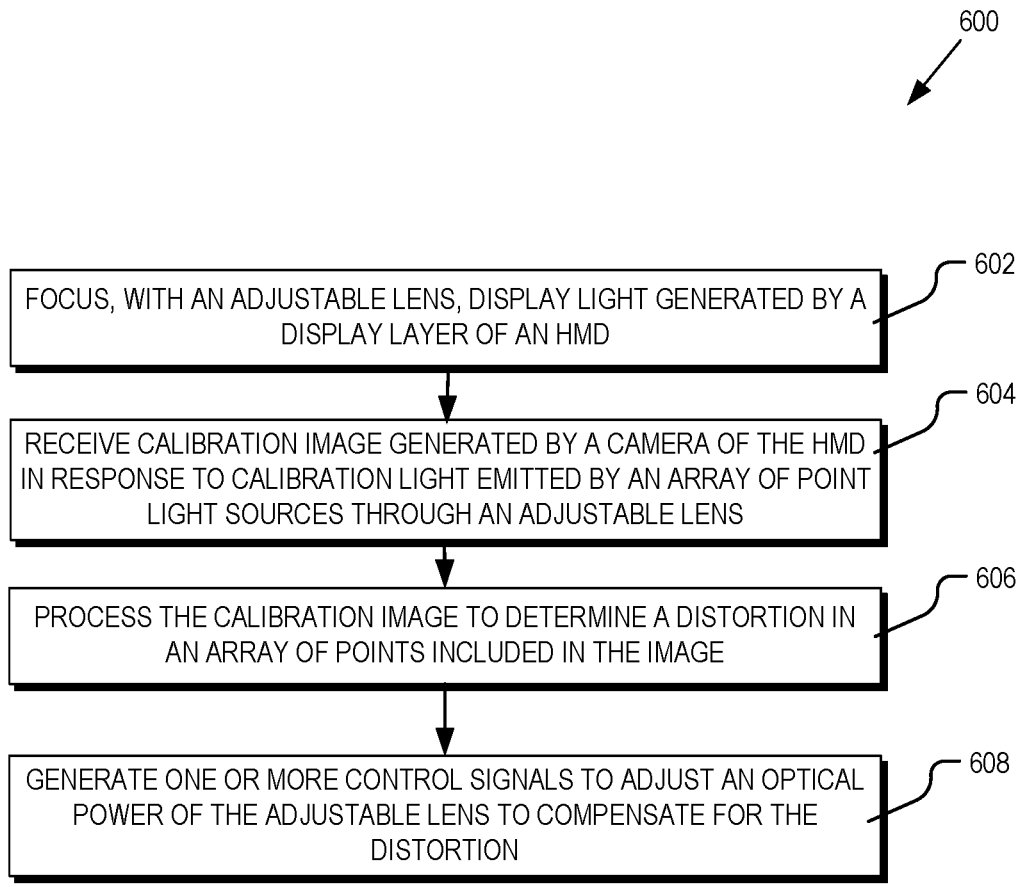
FIG. 6 is a flow chart illustrating a process of active optics feedback and calibration of an optical system of an HMD, in accordance with aspects of the present disclosure.

FIG. 6 is a flow chart illustrating a process 600 of active optics feedback and calibration of an optical system of an HMD, in accordance with aspects of the present disclosure. Process 600 is one possible process performed by the active optics block 514 of FIG. 5.

In a process block 602, the adjustable lens 113 focuses the display light 503. As mentioned above, the display light 503 may be visible light generated by the display layer 502 of the optical system 500. In one aspect, the adjustable lens 113 is configured to focus the display light 503 on the front side 109 of the optical system 500 for presentation to a user of the HMD (e.g., focused for eye 504). Next, in a process block 604, the adjustable lens controller 516 receives an image (e.g., calibration image 202B of FIG. 2B) that was generated by a camera (e.g., camera 110 of FIG. 5). As mentioned above, the camera 110 may generate the calibration image in response to calibration light 126 that was emitted by the array of point light sources 116A-116F through the adjustable lens 113. In some examples, the adjustable lens controller 516 is configured to control the switchable half-wave plate 508 for selectively multiplexing between the calibration light 126 and the infrared light 510. Thus, process block 604 may include the adjustable lens controller 516 sending one or more control signals 122 to the switchable half-wave plate 508 to configure the switchable half-wave plate 508 to pass the calibration light 126 to the camera 110 and to block the infrared light 510.

Next, in a process block 608, the adjustable lens controller 516 processes the calibration image to determine a distortion in the array of points included in the image. In one example, the adjustable lens controller 516 may detect the distortion (e.g., distortion 210 of FIG. 2B) based on the location of one or more of the points (e.g., points 204) included in calibration image. In process block 608, the adjustable lens controller 516 generates one or more control signals (e.g., control signals 122 of FIG. 5) to adjust the optical power of the adjustable lens 113 to compensate for the detected distortion.

In some examples, process block 608 may also include the adjustable lens controller 516 sending one or more additional control signals to the switchable half-wave plate 508 to configure the switchable half-wave plate 508 to return to an eye-tracking configuration that includes the switchable half-wave plate 508 passing the infrared light 510 to the camera 110 and blocking the calibration light 126.

Figure 7:
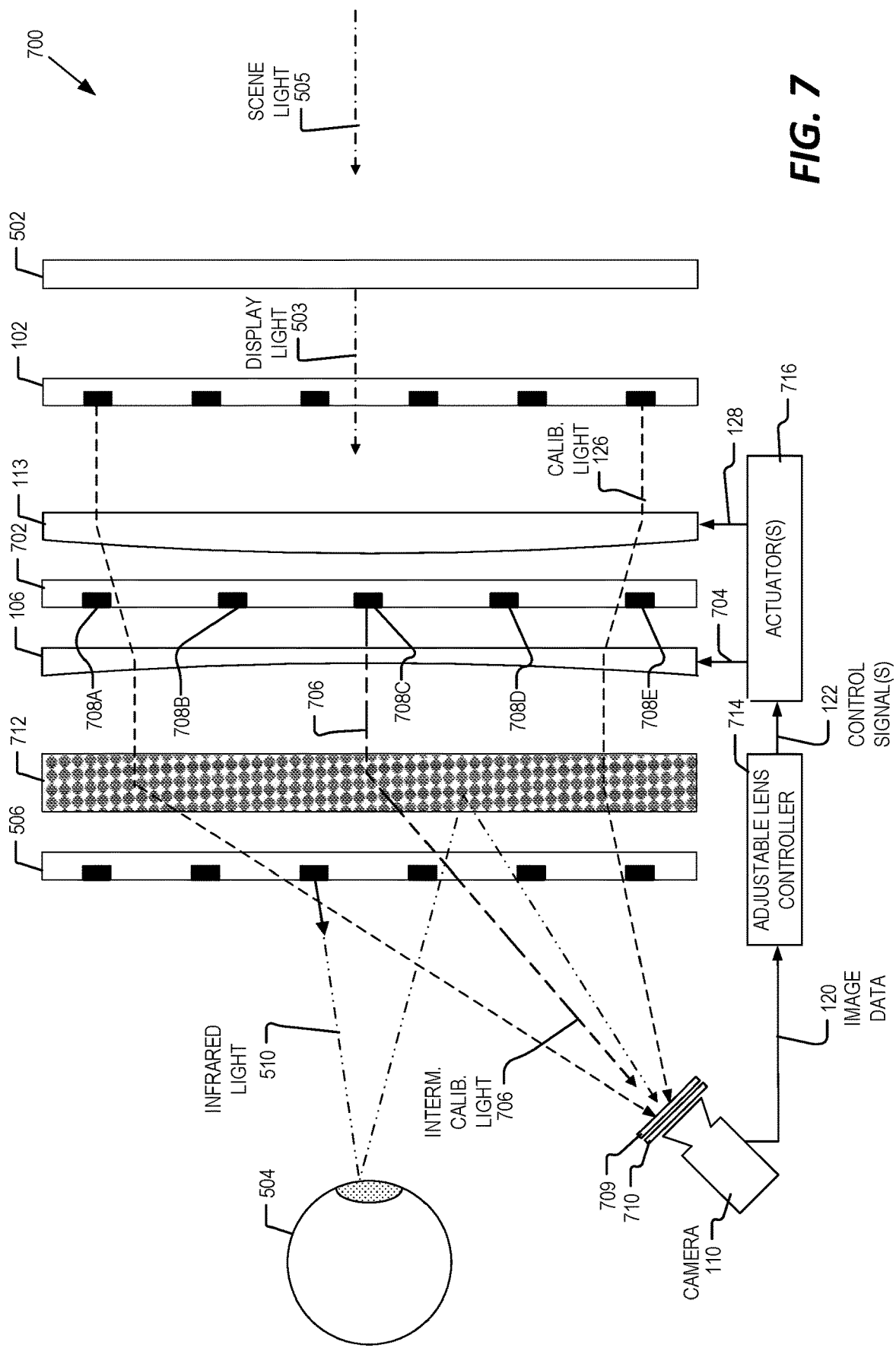
FIG. 7 illustrates an optical system of an HMD that includes an intermediate illumination layer, in accordance with aspects of the present disclosure.

FIG. 7 illustrates an optical system 700 of an HMD that includes an intermediate illumination layer 702, in accordance with aspects of the present disclosure. As mentioned above, the optical systems provided herein may include an optional second lens 106 that is disposed between the adjustable lens 113 and the optical combiner (e.g., optical combiner 712 of FIG. 7). In some aspects, second lens 106 is configured to focus scene light 505 for presentation to a user of the HMD, whereas adjustable lens 113 is configured to focus the display light 503. However, in some instances, the adjustments made to the optical power of the adjustable lens 113 may adversely affect the focus of the scene light 505. Thus, the second lens 106 may be configured to compensate for the effects that the adjustable lens 113 may have on the scene light 505. In some examples, the second lens 106 is also an adjustable lens such as a flexible polymer lens, a liquid lens, a deformable mirror, a liquid crystal lens, and so on. Thus, in some implementations, the optical system 700 is configured to provide feedback and calibration for the second lens 106 in addition to the feedback and calibration of the adjustable lens 113, discussed above.

For example, as shown in FIG. 7, the optical system 700 is shown as including an intermediate illumination layer 702 that includes a second array of point light sources 708A-708E. In some aspects, each of the point light sources 708A-708E may be disposed on a transparent substrate, arranged in a pattern (e.g., a two-dimensional array of rows and columns), and may be configured to emit intermediate calibration light 706 through the second lens 106. In some examples, the intermediate calibration light 706 is collimated light. In further examples, the intermediate calibration light 706 is infrared light such as light in the near infrared spectrum (e.g. 750 nm-1.4 µm). In some examples, each point light source 708A-708E may be a micro light emitting diode (micro-LED), an edge emitting LED, or a vertical cavity surface emitting laser (VCSEL) diode. In other examples, intermediate illumination layer 702 may include a lightguide for providing the second array of point light sources 708A-708E.

As shown in FIG. 7, the optical combiner 712 may be further configured to direct the intermediate calibration light 706 to the camera 110. Thus, the optical combiner 712 may be configured to direct the calibration light 126, the intermediate calibration light 706, and the infrared light 510 to the camera 110, where camera 110 is configured to generate: (1) a calibration image based on calibration light 126 for calibration of the adjustable lens 113; (2) an intermediate calibration image based on the intermediate calibration light 706 for calibration of the second lens 106; and (3) one or more images of the eye 504 based on the infrared light 510 for eye-tracking operations.

In operation, the second lens 106 focuses scene light 505 for presentation to the user of the HMD. The adjustable lens controller 714 may then receive an intermediate calibration image (e.g., calibration image 202B of FIG. 2B) where the intermediate calibration image was generated by camera 110 in response to the intermediate calibration light 706 emitted by the second array of point light sources 708A-708B through the second lens 106 and directed to the camera 110 by the optical combiner 712. In response to receiving the intermediate calibration image, the adjustable lens controller 714 may then process the intermediate calibration image to determine a distortion in the array of points included in the intermediate calibration image. The adjustable lens controller 714 may then generate control signals 122 to adjust an optical power of the second lens 106 to compensate for the distortion. As shown in FIG. 7, actuators 716 may include actuators for applying a force 704 to change a shape and/or curvature of the second lens 106. In addition, the actuators 716 may include actuators for applying the force 128 to change the shape and/or curvature of the adjustable lens 113 based on a calibration image generated by the camera 110 based on the calibration light 126.

In some aspects, the images captured by camera 110 are acquired at a predetermined sampling rate (e.g., 200 Hz). However, as mentioned above, the optical combiner 712 is configured to direct the reflected infrared light (e.g., infrared light 510), the calibration light 126, and the intermediate calibration light 706 towards the camera 110. Accordingly, in some examples, optical system 700 includes a switchable half-wave plate 709 and a polarization layer 710 that are disposed between the camera 110 and the optical combiner 712. In some aspects, the switchable half-wave plate 709 and polarization layer 710 are configured to selectively time-multiplex between: (1) light 126 and light 706; and (2) the infrared light 510. For example, the switchable half-wave plate 709 along with the polarization layer 710 may be selectively controlled between a first state and a second state, where the first state includes allowing infrared light 510 to pass through to camera 110, while blocking both the calibration light 126 and the intermediate calibration light 706. The second state may include allowing both the calibration light 126 and the intermediate calibration light 706 to pass through to the camera 110, while blocking the infrared light 510.

In other examples, rather than, or in addition to, the polarization-based time multiplexing, described above, aspects of the present disclosure may utilize spectrum-based time multiplexing or spectrum-based spatial multiplexing for switching between the calibration light 126 and the infrared light 510. For example, camera 110 may include spectrally sensitive Bayer filters or a time-varying spectral filter.

Figure 8:
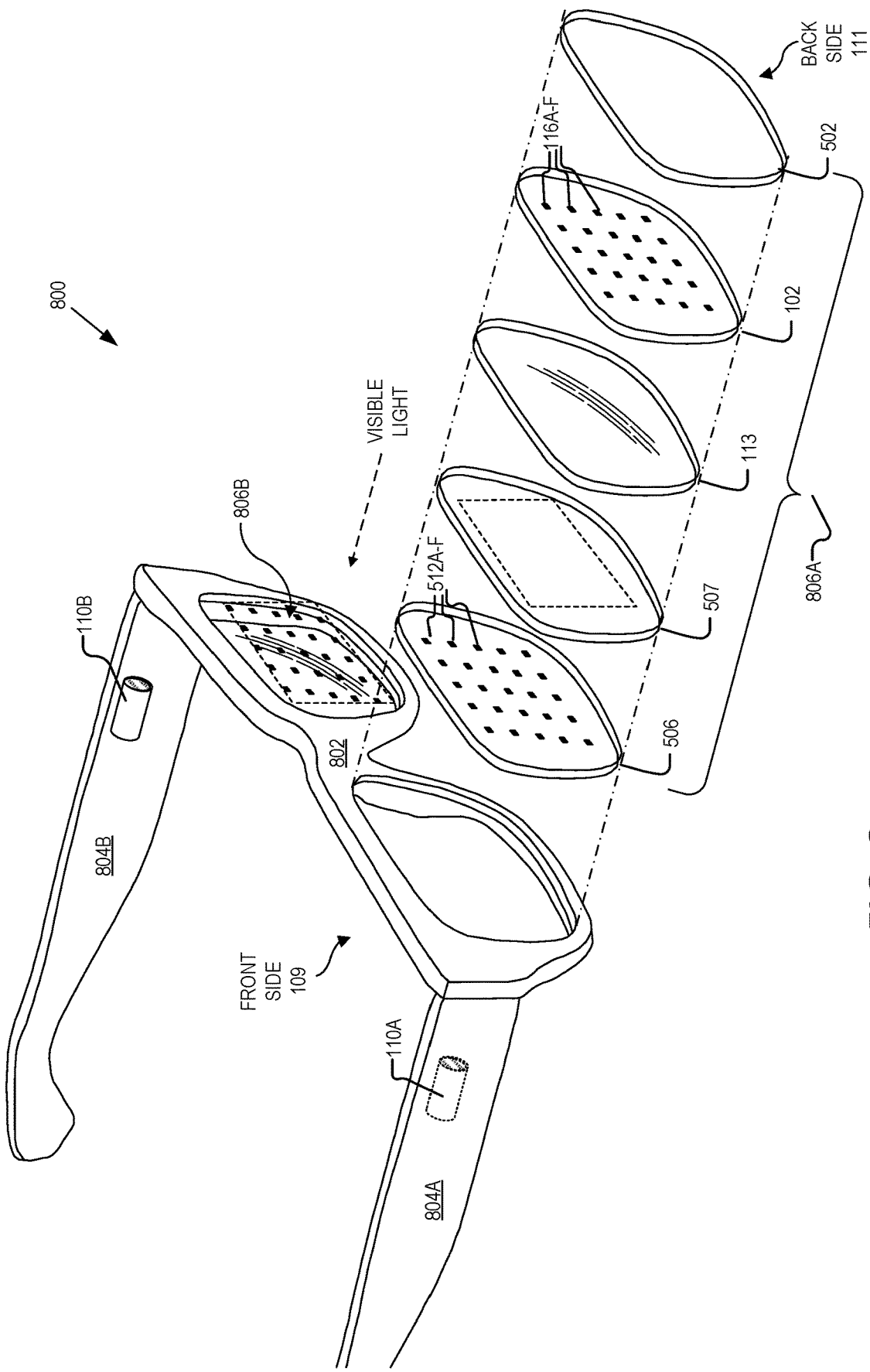
FIG. 8 illustrates an example HMD, in accordance with aspects of the present disclosure.

FIG. 8 illustrates an example HMD 800, in accordance with aspects of the present disclosure. HMD 800 is one possible HMD that incorporates any of the disclosed features discussed herein, including optical system 100 of FIG. 1, adjustable lens controller 302 of FIG. 3, optical system 500 of FIG. 5, and/or optical system 700 of FIG. 7.

The illustrated example of HMD 800 is shown as including a frame 802, temple arms 804A and 804B, and optical elements 806A and 806B. Cameras 110A and 110B are shown as coupled to temple arms 804A and 804B, respectively. FIG. 8 also illustrates an exploded view of an example of optical element 806A. Optical element 806A is shown as including illumination layer 506, optical combiner 507, adjustable lens 113, illumination layer 102, and display layer 502. The illumination layer 506 is shown as including the plurality of in-field light sources 512A-F and the illumination layer 102 is shown as including the plurality of point light sources 116A-F.

As shown in FIG. 8, frame 802 is coupled to temple arms 804A and 804B for securing the HMD 800 to the head of a user. Example HMD 800 may also include supporting hardware incorporated into the frame 802 and/or temple arms 804A and 804B (e.g., adjustable lens controller 516 and/or actuators 114). The hardware of HMD 800 may include any of processing logic, wired and/or wireless data interface for sending and receiving data, graphic processors, and one or more memories for storing data and computer-executable instructions. In one example, HMD 800 may be configured to receive wired power and/or may be configured to be powered by one or more batteries. In addition, HMD 800 may be configured to receive wired and/or wireless data including video data.

FIG. 8 illustrates optical elements 806A and 806B that are configured to be mounted to the frame 802. In some examples, optical elements 806A and 806B may appear transparent to the user to facilitate augmented reality or mixed reality such that the user can view scene light (e.g., visible light) from the environment while also receiving display light directed to their eye(s) by way of display layer 502. In further examples, some or all of optical elements 806A and 806B may be incorporated into a virtual reality headset where the transparent nature of the optical elements 806A and 806B allows the user to view an electronic display (e.g., a liquid crystal display (LCD), an organic light emitting diode (OLED) display, a micro-LED display, etc.) incorporated in the virtual reality headset.

The functionality of one or more components described above with reference to FIGS. 1-8 may be implemented in various ways consistent with the teachings herein. In some designs, the functionality of these components may be implemented as one or more discrete optical components. In addition, the components and functions represented by FIGS. 1-8, as well as other components and functions described herein, may be implemented using any suitable means. Such means also may be implemented, at least in part, using corresponding structure as taught herein. For example, a means for focusing display light generated by a display layer of an HMD for presentation to a user of the HMD may correspond at least in some aspects to, for example, the adjustable lens 113 of FIG. 1. In addition, a means for emitting calibration light through an adjustable lens may correspond at least in some aspects to, for example, the illumination layer 102 of FIG. 1. Even still, a means for capturing a calibration image in response to calibration light emitted by the array of point light sources may correspond at least in some aspect to, for example, the camera 110 of FIG. 1. A means for receiving and processing the calibration image, as well as generating one or more control signals to adjust an optical power of the adjustable lens to compensate for distortion may correspond at least in some aspect to, for example, the adjustable lens controller 112 of FIG. 1. Thus, in some aspects one or more of such means may be implemented using one or more optical components, layers, mediums, or other suitable structure as taught herein.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An optical system, comprising:
    an illumination layer having an array of point light sources configured to emit calibration light in an emitted pattern, wherein the illumination layer is configured to pass scene light, wherein the illumination layer is positioned to receive the scene light from a first side and pass the scene light out of a second side, wherein the illumination layer emits the calibration light from the second side;
    an optical combiner configured to pass the scene light to a front side of the optical system and to direct the calibration light to a camera that generates an image in response to the calibration light, wherein the image includes a captured pattern of an array of points corresponding to the array of point light sources; and
    an active optics block that includes a controller and that includes an adjustable lens disposed between the illumination layer and the optical combiner, wherein the adjustable lens is configured to pass the calibration light to the optical combiner and to focus the scene light, wherein the controller is configured to process the image to determine a distortion between the emitted pattern and the captured pattern of the array of the points included in the image, wherein the controller is configured to generate one or more control signals to vary a shape of the adjustable lens to compensate for the distortion.

2. The optical system of claim 1, wherein the illumination layer comprises a transparent substrate, and wherein the array of point light sources comprises a plurality of emitters disposed on the transparent substrate.

3. The optical system of claim 1, wherein the calibration light comprises infrared light.

4. The optical system of claim 1, wherein the calibration light comprises collimated light.

5. The optical system of claim 1, wherein the illumination layer comprises a lightguide for providing the array of point light sources to emit the calibration light.

6. The optical system of claim 1, wherein the active optics block further comprises at least one actuator configured to vary the shape of the adjustable lens.

7. The optical system of claim 6, wherein the adjustable lens comprises a liquid lens or a flexible polymer lens.

8. A method, comprising:
    emitting a first pattern of calibration light with an array of point light sources, wherein the calibration light passes through an adjustable lens and through an optical combiner towards a camera;
    generating, with the camera, an image of a second pattern in response to the calibration light, wherein the second pattern includes an array of points corresponding to the array of point light sources;
    receiving, with an adjustable lens controller, the image generated by the camera, wherein the calibration light is emitted by an illumination layer configured to carry the array of point light sources, wherein the illumination layer is configured to pass scene light, wherein the adjustable lens is positioned between the illumination layer and the optical combiner;
    processing, with the adjustable lens controller, the image to determine a distortion between the first pattern and the second pattern of the array of points included in the image; and
    generating, with the adjustable lens controller, one or more control signals to vary a shape of the adjustable lens to compensate for the distortion between the first pattern and the second pattern of the array of points included in the image.

9. The method of claim 8, wherein the array of point light sources comprises a plurality of vertical cavity surface emitting laser (VCSEL) diodes disposed on a transparent substrate.

10. The method of claim 8, wherein the calibration light comprises infrared light.

11. The method of claim 8, wherein the array of point light sources comprises a lightguide for emitting the calibration light.

12. The method of claim 8, wherein generating the one or more control signals comprises sending the one or more control signals to at least one actuator to vary the shape of the adjustable lens.

13. The method of claim 12, wherein the adjustable lens comprises a liquid lens or a flexible polymer lens.

14. The method of claim 8, wherein processing the image to determine the distortion comprises determining a location of at least one of the points included in the second pattern of the image.

15. An optical system, comprising:
    a camera configured to generate an image in response to calibration light;
    an illumination layer having an array of point light sources configured to emit the calibration light in a first pattern, wherein the illumination layer is configured to pass visible light, wherein the illumination layer is positioned to receive the visible light from a first side and pass the visible light out of a second side, wherein the illumination layer emits the calibration light from the second side;

an optical combiner configured to pass the visible light to a front side of the optical system and to direct the calibration light to the camera, wherein the image generated by the camera includes a second pattern of an array of points corresponding to the array of point light sources;

an adjustable lens disposed between the illumination layer and the optical combiner, the adjustable lens configured to pass the calibration light to the optical combiner and to focus the visible light; and a controller configured to: (a) process the image to determine a distortion between the first pattern and the second pattern of the array of the points included in the image, and (b) generate one or more control signals to adjust a shape of the adjustable lens to compensate for the distortion.

16. The optical system of claim 15, wherein the illumination layer comprises a transparent substrate, and wherein the array of point light sources comprises a plurality of vertical cavity surface emitting laser (VCSEL) diodes disposed on the transparent substrate.

17. The optical system of claim 15, wherein the illumination layer comprises a lightguide for providing the array of point light sources to emit the calibration light.

18. The optical system of claim 15, further comprising at least one actuator configured to vary the shape of the adjustable lens.

19. The optical system of claim 18, wherein the adjustable lens comprises a liquid lens or a flexible polymer lens.

* * * * *